United States Patent
Fischer-Toubol et al.

(10) Patent No.: US 10,061,638 B2
(45) Date of Patent: Aug. 28, 2018

(54) ISOLATING FAULTY COMPONENTS IN A CLUSTERED STORAGE SYSTEM WITH RANDOM REDISTRIBUTION OF ERRORS IN DATA (71) Applicant: INTERNATIONAL BUSINESS MACHINES CORPORATION, Armonk, NY (US)

(72) Inventors: Jonathan Fischer-Toubol, Tel Aviv (IL); Ronen Gazit, Tel Aviv (IL); Afief Halumi, Tel Aviv (IL); Lior Shlomov, Or Yehuda (IL); Ariel Waizel, Nes Ziona (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 134 days.

(21) Appl. No.: 15/083,528

(22) Filed: Mar. 29, 2016

(65) Prior Publication Data
US 2017/0286206 A1 Oct. 5, 2017

(51) Int. Cl.
G06F 11/07 (2006.01)
G11C 29/04 (2006.01)

(52) U.S. Cl.
CPC ........ *G06F 11/0793* (2013.01); *G06F 11/076* (2013.01); *G06F 11/0727* (2013.01);
(Continued)

(58) Field of Classification Search
CPC ............... G06F 11/0703; G06F 11/079; G06F 11/0793; G06F 11/076; G11C 29/44; G11C 2029/0409
See application file for complete search history.

(56) References Cited

U.S. PATENT DOCUMENTS 4,053,751 A * 10/1977 Ault ....................... G06F 11/076
365/1
5,251,227 A * 10/1993 Bruckert ................... G06F 1/24
714/23
(Continued)

FOREIGN PATENT DOCUMENTS

EP 2884392 A1 6/2015

OTHER PUBLICATIONS

Novark et al., "Exterminator: Automatically Correcting Memory Errors with High Probability," ACM, Jun. 11-13, 2007 (11 pages).

*Primary Examiner* — Joseph O Schell
(74) *Attorney, Agent, or Firm* — Griffiths & Seaton PLLC (57) ABSTRACT Methods, computing systems and computer program products implement embodiments of the present invention that include configuring, at a first time, a clustered storage system comprising multiple modules to store and process storage requests for respective sets of data objects. While processing the storage requests, respective subsets of the data objects having one or more data errors are identified, and at a second time subsequent to the first time, respective modules storing each of the data objects having at least one data error are identified. computing, based on the identified modules, a frequency distribution of the identified data errors in the data objects over the multiple modules. Based on the frequency distribution, a failure in a given module is identified, and the identified module is removed from the storage system. In some embodiments, prior to the second time, the data objects can be redistributed among the modules of the storage system.

20 Claims, 3 Drawing Sheets (52) U.S. Cl.
CPC ........ *G06F 11/0703* (2013.01); *G06F 11/079* (2013.01); *G11C 2029/0409* (2013.01)

(56) References Cited

U.S. PATENT DOCUMENTS

| | | | | |
|---|---|---|---|---|
| 6,158,025 | A | * 12/2000 | Brisse | .................... G06F 11/073 |
| | | | | 714/42 |
| 7,346,811 | B1 | 3/2008 | Gao et al. | |
| 7,702,966 | B2 | 4/2010 | Chandwani et al. | |
| 9,026,869 | B1 | 5/2015 | Li et al. | |
| 2003/0088816 | A1 | 5/2003 | Wu et al. | |
| 2006/0112219 | A1 | 5/2006 | Chawla et al. | |
| 2009/0125671 | A1 * | 5/2009 | Flynn | ......................... G06F 9/52 |
| | | | | 711/103 |
| 2010/0157766 | A1 * | 6/2010 | Gregg | .................... G06F 11/008 |
| | | | | 369/53.41 |
| 2010/0262795 | A1 * | 10/2010 | Hetzler | ............... G06F 11/1068 |
| | | | | 711/162 |
| 2012/0137167 | A1 * | 5/2012 | Leischner | ............. G06F 11/073 |
| | | | | 714/6.12 |
| 2012/0151276 | A1 * | 6/2012 | Bjorner | ............... G06F 11/0751 |
| | | | | 714/47.1 |
| 2014/0245106 | A1 * | 8/2014 | Leininger | ........... G06F 11/1016 |
| | | | | 714/764 |
| 2017/0123879 | A1 * | 5/2017 | Donlin | ................. G06F 11/0727 |

* cited by examiner

ISOLATING FAULTY COMPONENTS IN A CLUSTERED STORAGE SYSTEM WITH RANDOM REDISTRIBUTION OF ERRORS IN DATA

FIELD OF THE INVENTION

The present invention relates generally to storage systems, and specifically to isolating faulty components in a clustered storage system with random redistribution of errors in user data.

BACKGROUND

Clustered storage is the use of two or more storage servers working together to increase performance, capacity, or reliability. Clustering distributes workloads to each server, manages the transfer of workloads between servers, and provides access to all files from any server regardless of the physical location of the file.

Examples of clustered storage systems include tightly coupled clusters and loosely coupled clusters. A tightly coupled cluster has a proprietary physical backplane into which controller nodes connect. While this backplane fixes the maximum size of the cluster, it delivers a high-performance interconnect between servers for load-balanced performance and maximum scalability as the cluster grows. Additional array controllers, input/output (I/O) ports, and capacity can connect into the cluster as demand dictates.

A loosely coupled cluster offers cost-effective building blocks that can start small and grow as applications demand. A loose cluster offers performance, I/O, and storage capacity within the same node. As a result, performance scales with capacity and vice versa.

The description above is presented as a general overview of related art in this field and should not be construed as an admission that any of the information it contains constitutes prior art against the present patent application.

SUMMARY

There is provided, in accordance with an embodiment of the present invention a method, including configuring, at a first time, a storage system including multiple modules to store and process storage requests for respective sets of data objects, identifying, while processing the storage requests, respective subsets of the data objects having one or more data errors, identifying, at a second time subsequent to the first time, respective modules storing each of the data objects having at least one data error, computing, based on the identified modules, a frequency distribution of the identified data errors in the data objects over the multiple modules, identifying, based on the frequency distribution, a failure in a given module, and removing the identified module from the storage system.

There is also provided, in accordance with an embodiment of the present invention a storage system, including multiple modules configured at a first time to store and process storage requests for respective sets of data objects, each of the modules configured to identify, while processing the storage requests, respective subsets of the data objects having one or more data errors, to identify, at a second time subsequent to the first time, respective modules storing each of the data objects having at least one data error, to compute, based on the identified modules, a frequency distribution of the identified data errors in the data objects over the multiple modules, to identify, based on the frequency distribution, a failure in a given module, and to remove the identified module from the storage system.

There is further provided, in accordance with an embodiment of the present invention a computer program product, the computer program product including a non-transitory computer readable storage medium having computer readable program code embodied therewith, the computer readable program code including computer readable program code configured to arrange, at a first time, a storage system including multiple modules to store and process storage requests for respective sets of data objects, computer readable program code configured to identify, while processing the storage requests, respective subsets of the data objects having one or more data errors, computer readable program code configured to identify, at a second time subsequent to the first time, respective modules storing each of the data objects having at least one data error, computer readable program code configured to compute, based on the identified modules, a frequency distribution of the identified data errors in the data objects over the multiple modules, computer readable program code configured to identify, based on the frequency distribution, a failure in a given module, and computer readable program code configured to remove the identified module from the storage system.

BRIEF DESCRIPTION OF THE DRAWINGS

The disclosure is herein described, by way of example only, with reference to the accompanying drawings, wherein.

DETAILED DESCRIPTION OF EMBODIMENTS

Hardware and/or software malfunctions in a storage system may result in faulty data (i.e., errors in the data) being written to a storage device, and the faulty data may only first be detected upon subsequently processing a read operation on the data. When errors are detected in stored data, it is beneficial to be able to identify a faulty hardware or software component causing the error in order to take the identified component offline before more data is compromised. This problem can be exacerbated in a clustered storage system comprising multiple modules, where data objects including faulty data (specifically data with undetected errors) may occasionally be redistributed across the modules.

Embodiments of the present invention provide methods and systems for identifying and isolating faulty modules in a clustered storage system that may occasionally perform data object redistribution. As described hereinbelow, at a first time, a storage system comprising multiple modules is configured to store and process storage requests for respective sets of data objects, and while processing the storage requests, respective subsets of the data objects having one or more data errors are identified. In other words, as the storage system serves and processes storage requests, it identifies errors in the data objects, and collects the associates the identified errors with the data objects.

At a second time subsequent to the first time, respective modules storing each of the data objects having at least one data error are identified (i.e., the modules storing the data objects are identified at the second time in case the data objects were redistributed in the storage system). A frequency distribution of the identified errors in the data objects over all the modules in the storage system is computed, and a failure in a given module is identified based on the frequency distribution. The frequency distribution is such that it is not sensitive to the redistribution of data objects. Upon identifying the failure in the given module, the given module can be isolated by removing it from the clustered storage system.

In some embodiments, the frequency distribution may indicate a system-wide fault in the storage system. For example, there may be a bug in software executing in all the modules of the storage system. In this case, upon identifying the system-wide fault, the entire storage system can be deactivated and taken off-line.

Figure 1:
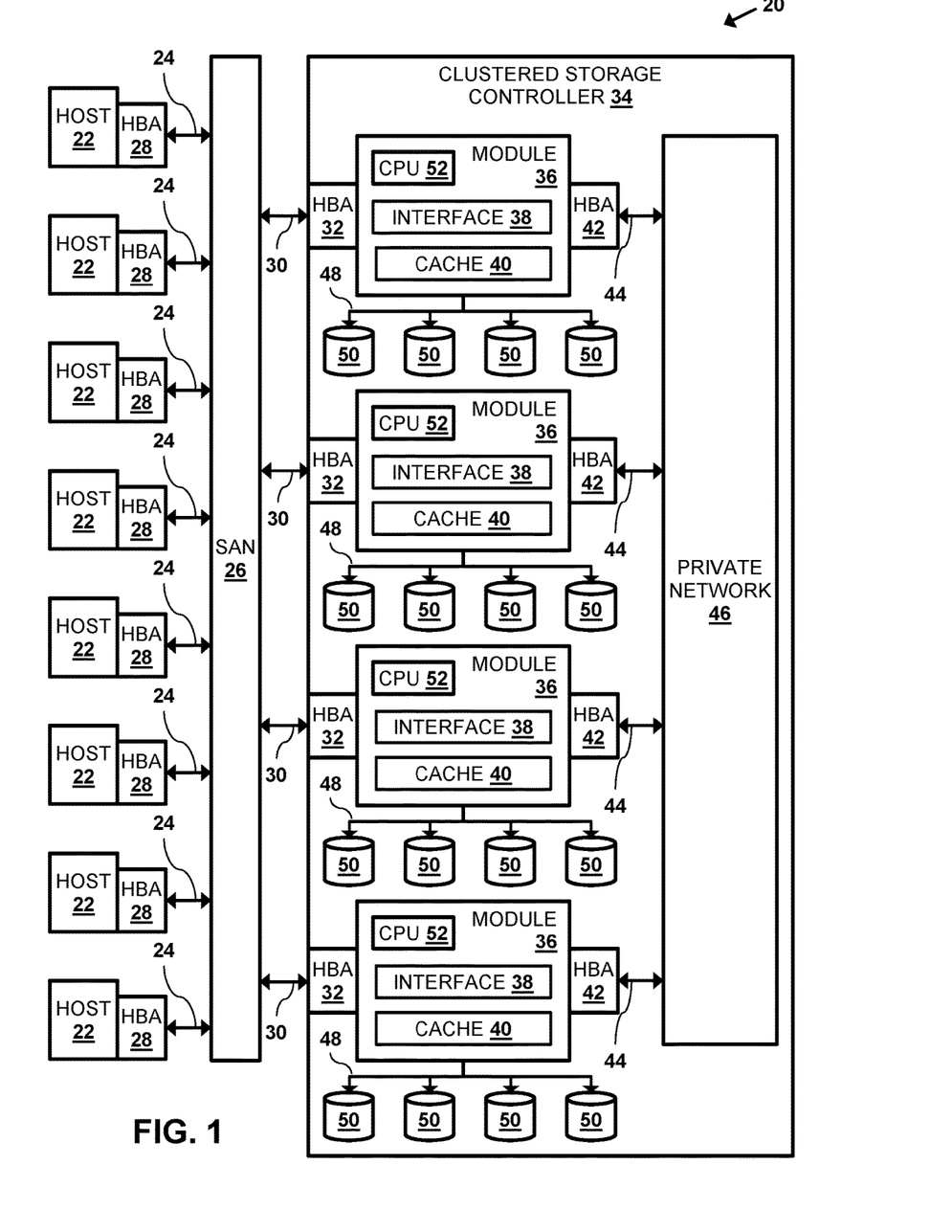
FIG. 1 is a block diagram that schematically illustrates a storage system comprising a clustered storage controller having multiple modules, in accordance with an embodiment of the present invention.

FIG. 1 is a block diagram that schematically illustrates a data processing storage subsystem 20, in accordance with an embodiment of the invention. The particular subsystem (also referred to herein as a storage system) shown in FIG. 1 is presented to facilitate an explanation of the invention. However, as the skilled artisan will appreciate, the invention can be practiced using other computing environments, such as other storage subsystems with diverse architectures and capabilities.

Storage subsystem 20 receives, from one or more host computers 22, input/output (I/O) requests, which are commands to read or write data at logical addresses on logical volumes. Any number of host computers 22 are coupled to storage subsystem 20 by any means known in the art, for example, using a network. Herein, by way of example, host computers 22 and storage subsystem 20 are assumed to be coupled by a Storage Area Network (SAN) 26 incorporating data connections 24 and Host Bus Adapters (HBAs) 28. The logical addresses specify a range of data blocks within a logical volume, each block herein being assumed by way of example to contain 512 bytes. For example, a 10 KB data record used in a data processing application on a given host computer 22 would require 20 blocks, which the given host computer might specify as being stored at a logical address comprising blocks 1,000 through 1,019 of a logical volume. Storage subsystem 20 may operate in, or as, a SAN system.

Storage subsystem 20 comprises a clustered storage controller 34 coupled between SAN 26 and a private network 46 using data connections 30 and 44, respectively, and incorporating adapters 32 and 42, again respectively. In some configurations, adapters 32 and 42 may comprise host bus adapters (HBAs). Clustered storage controller 34 implements clusters of storage modules 36, each of which includes a processor 52, an interface 40 (in communication between adapters 32 and 42), and a cache 38. Each storage module 36 is responsible for a number of storage devices 50 by way of a data connection 48 as shown.

As described previously, each storage module 36 further comprises a given cache 38. However, it will be appreciated that the number of caches 38 used in storage subsystem 20 and in conjunction with clustered storage controller 34 may be any convenient number. While all caches 38 in storage subsystem 20 may operate in substantially the same manner and comprise substantially similar elements, this is not a requirement. Each of the caches 38 may be approximately equal in size and is assumed to be coupled, by way of example, in a one-to-one correspondence with a set of physical storage devices 50, which may comprise disks. In one embodiment, physical storage devices may comprise such disks. Those skilled in the art will be able to adapt the description herein to caches of different sizes.

Each set of storage devices 50 comprises multiple slow and/or fast access time mass storage devices, herein below assumed to be multiple hard disks. FIG. 1 shows caches 38 coupled to respective sets of storage devices 50. In some configurations, the sets of storage devices 50 comprise one or more hard disks, or solid state drives (SSDs) which can have different performance characteristics. In response to an I/O command, a given cache 38, by way of example, may read or write data at addressable physical locations of a given storage device 50. In the embodiment shown in FIG. 1, caches 38 are able to exercise certain control functions over storage devices 50. These control functions may alternatively be realized by hardware devices such as disk controllers (not shown), which are linked to caches 38.

Each storage module 36 is operative to monitor its state, including the states of associated caches 38, and to transmit configuration information to other components of storage subsystem 20 for example, configuration changes that result in blocking intervals, or limit the rate at which I/O requests for the sets of physical storage are accepted.

Routing of commands and data from HBAs 28 to clustered storage controller 34 and to each cache 38 may be performed over a network and/or a switch. Herein, by way of example, HBAs 28 may be coupled to storage modules 36 by at least one switch (not shown) of SAN 26, which can be of any known type having a digital cross-connect function. Additionally or alternatively, HBAs 28 may be coupled to storage modules 36.

In some embodiments, data having contiguous logical addresses can be distributed across modules 36, and within the storage devices in each of the modules. Alternatively, the data can be distributed using other algorithms, e.g., byte or block interleaving. In general, this increases bandwidth, for instance, by allowing a volume in a SAN or a file in network attached storage to be read from or written to more than one given storage device 50 at a time. However, this technique requires coordination among the various storage devices, and in practice may require complex provisions for any failure of the storage devices, and a strategy for dealing with error checking information, e.g., a technique for storing parity information relating to distributed data. Indeed, when logical unit partitions are distributed in sufficiently small granularity, data associated with a single logical unit may span all of the storage devices 50.

While such hardware is not explicitly shown for purposes of illustrative simplicity, clustered storage controller 34 may be adapted for implementation in conjunction with certain hardware, such as a rack mount system, a midplane, and/or a backplane. Indeed, private network 46 in one embodiment may be implemented using a backplane. Additional hardware such as the aforementioned switches, processors, controllers, memory devices, and the like may also be incorporated into clustered storage controller 34 and elsewhere within storage subsystem 20, again as the skilled artisan will appreciate. Further, a variety of software components, operating systems, firmware, and the like may be integrated into one storage subsystem 20.

Storage devices 50 may comprise a combination of high capacity hard disk drives and solid state disk drives. In some embodiments each of storage devices 50 may comprise a logical storage device. In storage systems implementing the Small Computer System Interface (SCSI) protocol, the logical storage devices may be referred to as logical units, or LUNs. While each LUN can be addressed as a single logical unit, the LUN may comprise a combination of high capacity hard disk drives and/or solid state disk drives.

While the configuration in FIG. 1 shows storage controller 34 comprising four modules 36 and each of the modules coupled to four storage devices 50, a given storage controller comprising any multiple of modules 36 coupled to any plurality of storage devices 50 is considered to be with the spirit and scope of the present invention.

Figure 2:
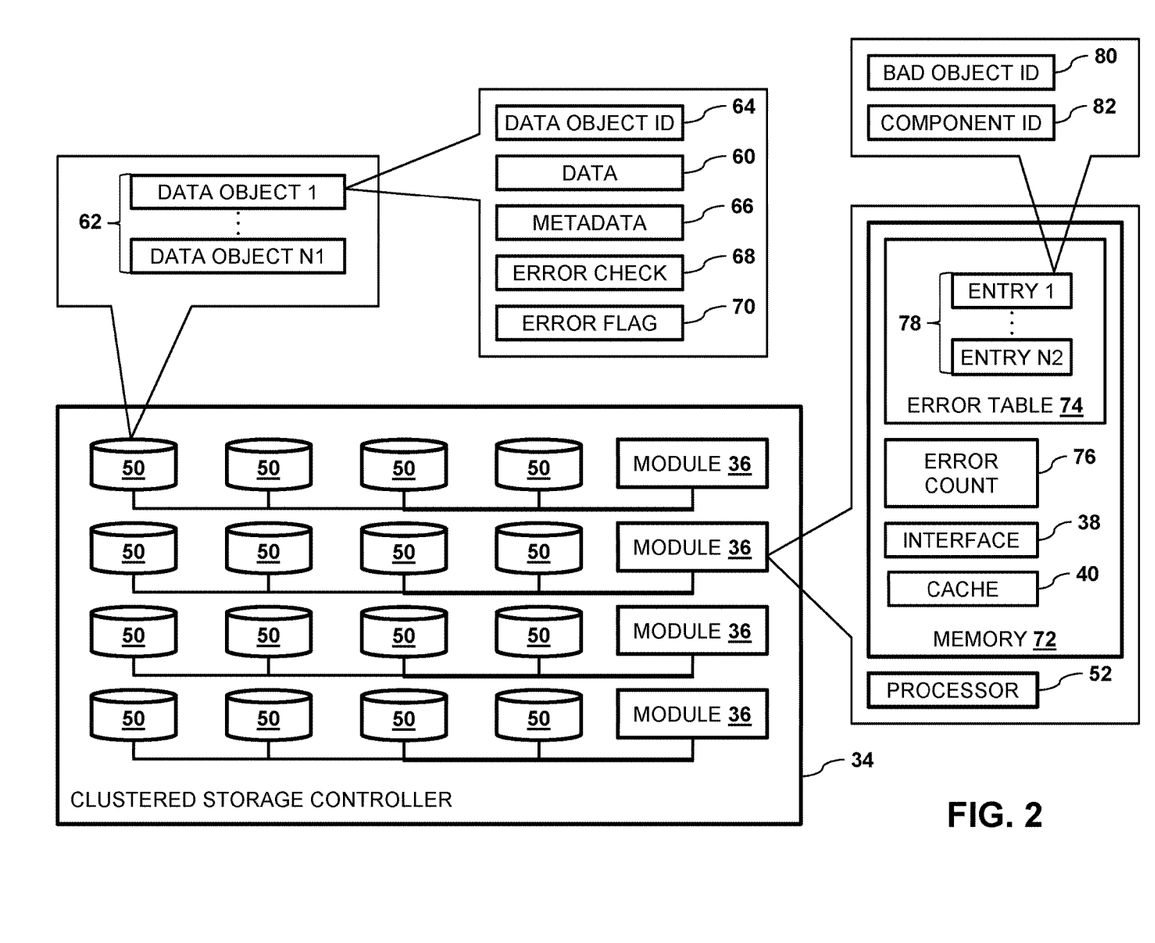
FIG. 2 is a block diagram that schematically illustrates software and hardware components that enable the clustered storage controller to detect and isolate a faulty given module, in accordance with an embodiment of the present invention.

FIG. 2 is a block diagram that schematically illustrates clustered storage controller 34 configured to detect and isolate a given module 36, in accordance with an embodiment of the present invention. In some embodiments, as described in the description referencing FIG. 3 hereinbelow, clustered storage controller 34 can be configured to detect and isolate a given component (e.g., a given storage device 50) in a given module 36.

In the example shown in FIG. 2, clustered storage controller 34 implements object storage. Object storage is a storage architecture that manages data as objects, as opposed to other storage architectures like file systems which manage data as a file hierarchy and block storage which manages data as blocks within sectors and tracks. Each object typically includes the data itself, a variable amount of metadata, and a globally unique identifier. Object storage can be implemented at multiple levels, including the device level (object storage device), the system level, and the interface level. In each case, object storage seeks to enable capabilities not addressed by other storage architectures, like interfaces that can be directly programmable by the application, a namespace that can span multiple instances of physical hardware, and data management functions like data replication and data distribution at object-level granularity.

In embodiments of the present invention, clustered storage controller 34 stores and manages data 60 in data objects 62 that are distributed across storage devices 50. In addition to data 60, each data object 62 comprises a data object identifier 64, metadata 66 that describes the data object, an error check 68 and an error flag 70. Each error check 68 comprises a mathematical calculation (e.g., a parity calculation, a checksum or a cyclic redundancy check) that storage controller 34 can use to determine the integrity of data 60. In embodiments described herein, a given processor 52 can set the error flag for a given data object 62 upon determining, using error check 68, that the data for the given data object is not valid.

In addition to processor 52, each module 36 comprises a memory 72 that stores cache 38, interface 40, an error table 74, and an error counter 76. In embodiments of the present invention, upon a given processor 52 in a given module 36 detecting a given object 62 in the given module that whose data is no valid (i.e., the data contains errors), the given processor can add an entry 78 for the given module to error table 74. In some embodiments, upon receiving a request to access the data in the given data object, the given processor can return an error code upon identifying the entry indicating the given data object.

In the example shown in FIG. 2, each entry 78 comprises a bad data object identifier 80 (that indicates a given data object 62 having non valid data 60). Each entry 78 may also comprise a component identifier 82. In some embodiments, a failure causing data corruption may be limited to a single component (e.g., a given storage device 50) in a given module. Using component identifier 82 to identify the bad component can enable clustered storage controller 34 to isolate the given component as opposed to isolating a given module 36 comprising the given component.

Processors 52 comprise general-purpose central processing units (CPU) or special-purpose embedded processors, which are programmed in software or firmware to carry out the functions described herein. The software may be downloaded to modules 36 in electronic form, over a network, for example, or it may be provided on non-transitory tangible media, such as optical, magnetic or electronic memory media. Alternatively, some or all of the functions of processors 52 be carried out by dedicated or programmable digital hardware components, or using a combination of hardware and software elements.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Faulty Component and Module Detection and Isolation

Figure 3:
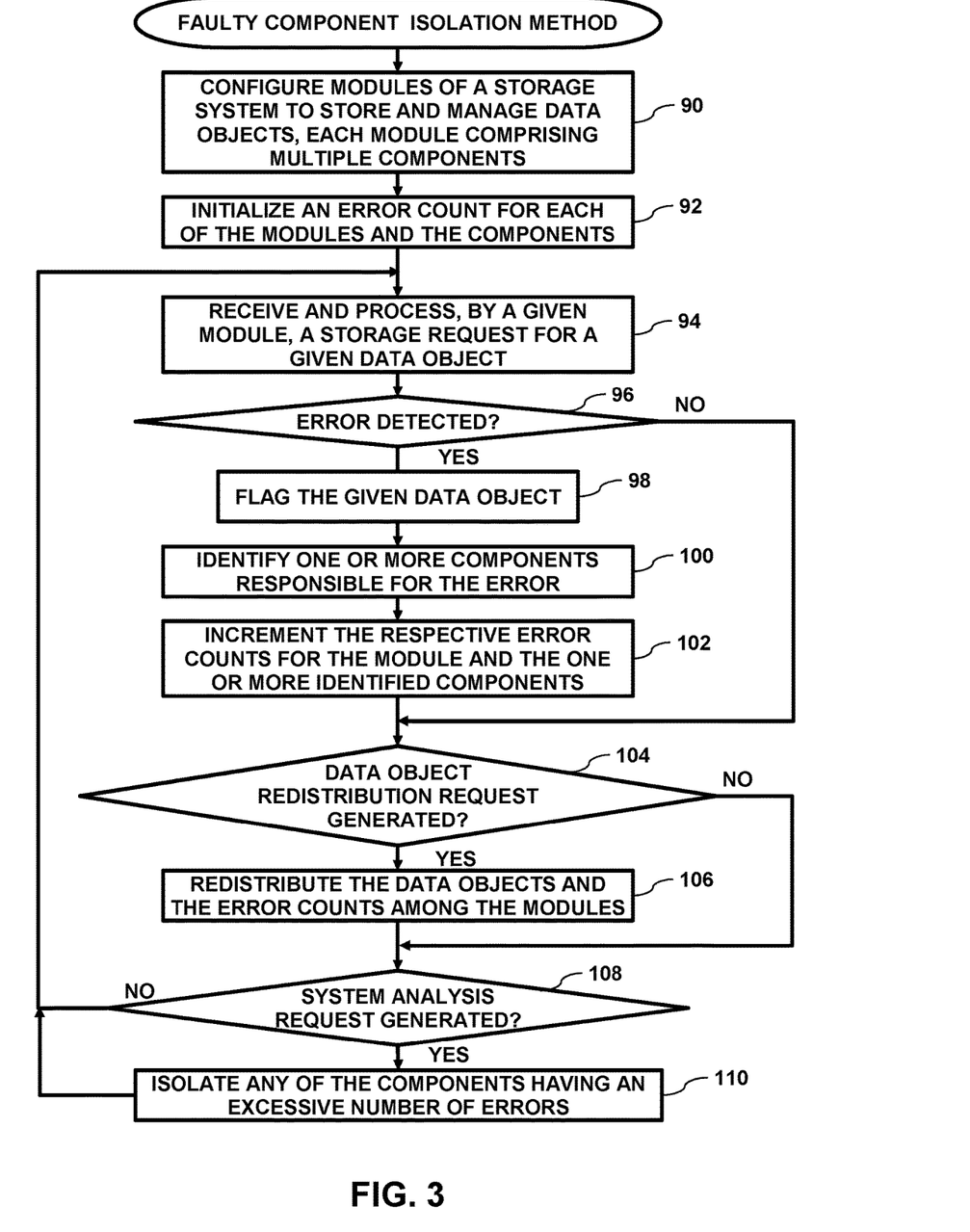
FIG. 3 is a flow diagram that schematically illustrates a method of detecting and isolating the given module, in accordance with an embodiment of the preset invention.

FIG. 3 is a flow diagram that schematically illustrates a method of isolating a given faulty module 36, in accordance with an embodiment of the preset invention. In some embodiments, instead of isolating an entire module 36, the method described in the flow diagram can be used to isolate a given faulty component (e.g., a given storage device 50) in a given module 36.

In a configuration step 90, clustered storage controller 34 is configured (e.g., via a given host computer 22) to store and manage data objects 62. While embodiments described herein comprise storage controller 34 detecting errors while storing and managing data objects 62, detecting errors and isolating a given module 36 (or a given component in the modules) while storing any type of data 60 is considered to be within the spirit and scope of the present invention.

In an initialization step 92, processors 52 initialize respective error counters 76, and in a processing step 94, a given processor 52 in a given module 36 receives and processes a storage request (e.g., an I/O request) for a given data object 62 stored in the given module. In a first comparison step 96, if the given processor detects an error in the data processed by the storage request (i.e., via error check 68), then the given processor flags the given data object in a flag step 98. In embodiments of the present invention, the error is typically due to a hardware failure or a software failure (e.g., a bug). In some embodiments, the given processor flags the given object by setting error flag 70 in the given object to a value that indicates the data error, thereby enabling processors 52 to accumulate an error count for each of the data objects.

In an identification step 100, the given processor identifies a given component (e.g., a given storage device 50 in a given module 36) that is causing the error, and in an increment step 102, the given processor increments error counter 76 in the given module. In some embodiments, memory 72 may store additional error counters 76 for components (e.g., storage devices 50) in each of the modules. In these embodiments, if the given processor can identify a given component in the given module that is causing the data errors, then the given processor can increment the appropriate error counter.

In a second comparison step 104, if clustered storage controller 34 generates a data object redistribution request, then in a redistribution step 106, processors 52 redistribute data objects 62 across storage devices 50 in modules 36, and redistributes error counters 76 accordingly. Upon redistributing a given data object 62 from a first given module 36 to a second given module 36, clustered storage controller 34 reconfigures the second given module to process storage requests for the given data object.

In a third comparison step 108, if clustered storage controller 34 or a given host computer 22 generates an analysis request, then in an isolation step 110, the given processor conveys a message to clustered storage controller 34 to isolate (i.e., remove from operation) the given module (or the identified component), and the method continues with step 94. If some embodiments, error counters 76 can be reset upon isolating any given module or component from clustered storage controller 34. In additional embodiments, error counters 76 may be reset, or periodically reduced in order to introduce a time window for which the divergence statistical measure is evaluated. In further embodiments error counters 76 may be reduced if the detected errors are infrequent enough to be considered within a specified (or calculated) "normal" range.

While processing step 110, a given processor 52 in clustered storage controller 34 can analyze a frequency distribution of error counters 76 for each module 36 to determine if any of the modules need to be isolated and removed (i.e., deactivated) from storage controller 34. In some embodiments, if clustered storage controller 34 comprises n modules, the clustered storage controller can use the logical equation $$E_x \geq F^* \text{AvgErrs}(n-x) \qquad (1)$$

in order to determine if a given module x needs to be isolated. In the equation, $E_x$ comprises error counter 76 for the given module, F comprises a user-specified factor, and AvgErrs(n−x) comprises an average of the error counters for all the remaining (i.e., excluding the given module) modules 36 in the clustered storage controller.

In some embodiments, clustered storage controller 34 can deactivate a given module 36 upon calculating the logical equation presented supra as "true". For example, if factor F is five, then clustered storage controller 34 will isolate a given module 36 if the number of error detected for the given module is greater than or equal to five times the average of the detected errors in the remaining modules.

In alternative embodiments, clustered storage controller 34 can isolate a given module 36 (or a given component in the module) if a divergence of error count 76 of the given module (or component) is above a specified threshold (e.g., if a given error count 76 is greater than a specified factor times an average of the error counts, or if the given error count is the factor times sigma from the average of the error counts). In additional embodiments, if an average (or a sum of the) number of error counts 76 across all the modules is above a specified threshold, then clustered storage controller 34 can deactivate itself by taking the clustered storage controller offline.

Returning to step 108, if clustered storage controller 34 or a given host computer 22 do not generate an analysis request, then the method continues with step 94. Returning to step 104, if clustered storage controller 34 does not generate a data object redistribution request, then the method continues with step 108. Returning to step 96, if the given processor does not detect an error in the given data object, then the method continues with step 104

While embodiments described hereinabove comprise one or more processors 52 (i.e., one or more modules 36 in the clustered storage controller) other configurations for analyzing errors and isolating a given module 36 are considered to be within the spirit and scope of the present invention. In one alternative embodiment, a given host computer 22 can be programmed to perform the analysis and isolation. In another alternative embodiment error counts 76 can be presented to a system administrator on a display (not shown) coupled to either a given module 36 or a given host computer 22, and the isolation can be performed in response to an input (e.g., via a keyboard) from the system administrator.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for faulty component isolation, by a processor, comprising:
configuring, at a first time, a storage system comprising multiple modules to store and process storage requests for respective sets of data objects;
identifying, while processing the storage requests, respective subsets of the data objects having one or more data errors;
identifying, at a second time subsequent to the first time, respective modules storing each of the data objects having at least one data error;
computing, based on the identified modules, a frequency distribution of the one or more data errors in the data objects over the multiple modules;
identifying, based on the frequency distribution, a failure in a given module; and
removing the given module having the identified failure from the storage system such that faulty data associated with the given module having the identified failure is not redistributed across remaining modules of the multiple modules of the storage system.

2. The method according to claim 1, and comprising, prior to the second time, moving a given data object from a first given module to a second given module, and reconfiguring the second given module to process storage requests for the given data object.

3. The method according to claim 1, wherein each of the multiple modules is associated with an error counter, and wherein determining the failure comprises identifying that a respective error counter for the one of the modules exceeds a specified threshold.

4. The method according to claim 3, wherein determining the failure comprises determining that a sum of the error counters of each of the multiple modules exceeds a specified threshold.

5. The method according to claim 1, wherein determining the failure in the given module is in response to comparing a number of detected errors in the given module to an average of respective numbers of detected errors in the remaining modules of the multiple modules.

6. The method according to claim 1, and comprising deactivating the storage system upon determining, based on a generated analysis request, a failure in the storage system.

7. The method according to claim 1, wherein each of the modules comprises multiple components, wherein identifying the failure in the given module comprises identifying the failure in a given component in the given module, and wherein removing the given module having the identified failure from the storage system comprises removing the given component from the storage system.

8. A storage system, comprising:
a processor executing instructions stored in a memory device, the processor in communication with multiple modules configured at a first time to store and process storage requests for respective sets of data objects, wherein, the instructions, when executed, cause the processor to configure each of the multiple modules:
to identify, while processing the storage requests, respective subsets of the data objects having one or more data errors,
to identify, at a second time subsequent to the first time, respective modules storing each of the data objects having at least one data error,
to compute, based on the identified modules, a frequency distribution of the one or more data errors in the data objects over the multiple modules,
to identify, based on the frequency distribution, a failure in a given module, and
to remove the given module having the identified failure from the storage system such that faulty data associated with the given module having the identified failure is not redistributed across remaining modules of the multiple modules of the storage system.

9. The storage system according to claim 8, wherein the instructions, when executed, cause the processor to configure each of the multiple modules to move a given data object from a first given module to a second given module, and to reconfigure the second given module to process storage requests for the given data object.

10. The storage system according to claim 8, wherein each of the multiple modules is associated with an error counter, and wherein a given module is configured to determine the failure by identifying that a respective error counter for the identified module exceeds a specified threshold.

11. The storage system according to claim 10, wherein the instructions, when executed, cause the processor to configure each of the multiple modules to determine the failure by determining that a sum of the error counters of each of the multiple modules exceeds a specified threshold.

12. The storage system according to claim 8, wherein the instructions, when executed, cause the processor to configure each of the multiple modules to determine the failure in the given module in response to comparing a number of detected errors in the given module to an average of respective numbers of detected errors in the remaining modules of the multiple modules.

13. The storage system according to claim 8, wherein the instructions, when executed, cause the processor to configure each of the multiple modules to deactivate the storage system upon determining, based on a generated analysis request, a failure in the storage system.

14. The storage system according to claim 8, wherein each of the modules comprises multiple components, wherein a given module is configured to identify the failure in the given module by identifying the failure in a given component in the given module, and wherein the given module is configured to remove the given module having the identified failure from the storage system by removing the given component from the storage system.

15. A computer program product for faulty component isolation, by a processor, the computer program product comprising:
    a non-transitory computer readable storage medium having computer readable program code embodied therewith, the computer readable program code comprising:
    computer readable program code configured to arrange, at a first time, a storage system comprising multiple modules to store and process storage requests for respective sets of data objects;
    computer readable program code configured to identify, while processing the storage requests, respective subsets of the data objects having one or more data errors;
    computer readable program code configured to identify, at a second time subsequent to the first time, respective modules storing each of the data objects having at least one data error;
    computer readable program code configured to compute, based on the identified modules, a frequency distribution of the one or more data errors in the data objects over the multiple modules;
    computer readable program code configured to identify, based on the frequency distribution, a failure in a given module; and
    computer readable program code configured to remove the given module having the identified failure from the storage system such that faulty data associated with the given module having the identified failure is not redistributed across remaining modules of the multiple modules of the storage system.

16. The computer program product according to claim 15, and comprising computer readable program code configured, prior to the second time, to move a given data object from a first given module to a second given module, and to reconfigure the second given module to process storage requests for the given data object.

17. The computer program product according to claim 15, wherein each of the multiple modules is associated with an error counter, and wherein the computer readable program code is configured to determine the failure by identifying that a respective error counter for the one of the modules exceeds a specified threshold.

18. The computer program product according to claim 17, wherein the computer readable program code is configured to determine the failure by determining that a sum of the error counters of each of the multiple modules exceeds a specified threshold.

19. The computer program product according to claim 15, and comprising computer readable program code configured to deactivate the storage system upon determining, based on a generated analysis request, a failure in the storage system.

20. The computer program product according to claim 15, wherein each of the modules comprises multiple components, wherein the computer readable program code is configured to identify the failure in the given module by identifying the failure in a given component in the given module, and wherein the computer readable program code is configured to remove the given module having the identified failure from the storage system by removing the given component from the storage system.

* * * * *